(12) United States Patent
Jain

(10) Patent No.: US 11,456,267 B2
(45) Date of Patent: Sep. 27, 2022

(54) FET CONSTRUCTION WITH COPPER PILLARS OR BUMP DIRECTLY OVER THE FET

(71) Applicant: Texas Instruments Incorporated, Dallas, TX (US)

(72) Inventor: Manoj Kumar Jain, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/124,485

(22) Filed: Dec. 16, 2020

(65) Prior Publication Data

US 2022/0189898 A1 Jun. 16, 2022

(51) Int. Cl.
*H01L 23/00* (2006.01)
*H01L 23/522* (2006.01)

(52) U.S. Cl.
CPC .......... *H01L 24/13* (2013.01); *H01L 23/5226* (2013.01); *H01L 24/11* (2013.01); *H01L 2224/13082* (2013.01); *H01L 2224/13147* (2013.01); *H01L 2224/13155* (2013.01)

(58) Field of Classification Search
CPC ..... H01L 24/13; H01L 23/5226; H01L 24/11; H01L 2224/13082; H01L 2224/13147; H01L 2224/13155
See application file for complete search history.

(56) References Cited

U.S. PATENT DOCUMENTS 10,541,220 B1 * 1/2020 Komatsu ........... H01L 21/02288
10,879,206 B1 * 12/2020 Wu .......................... H01L 24/94
2012/0018868 A1 1/2012 Oganesian et al.
2014/0264931 A1 * 9/2014 Wang ................ H01L 21/76801
257/774
2015/0171039 A1 6/2015 Cheng et al.
2021/0118830 A1 * 4/2021 Huang ..................... H01L 24/05
2021/0143114 A1 * 5/2021 Chien ..................... H01L 24/13
2021/0159197 A1 * 5/2021 Huang ..................... H01L 21/56

FOREIGN PATENT DOCUMENTS

DE 102011010362 A1 8/2012

OTHER PUBLICATIONS

Patent Cooperation Treaty International Search Report for T79746WO, PCT/US 2021/061949 filed Dec. 6, 2021.

* cited by examiner

*Primary Examiner* — Douglas W Owens
(74) *Attorney, Agent, or Firm* — Jacqueline J. Garner; Charles A. Brill; Frank D. Cimino

(57) ABSTRACT

A method of forming a semiconductor device with a metal pillar overlapping a first top metal interconnect and a second top metal interconnect is disclosed. The metal pillar overlapping the first top metal interconnect and second top metal interconnect is connected to the first top metal interconnect by top metal vias while the second top metal interconnect does not contain top metal vias and remains free of a direct electrical connection to the metal pillar. The metal pillars are attached directly to top metal vias without a bond pad of metal. The elimination of the bond pad layer reduces the mask count, processing, and cost of the device. In addition, the elimination of the bond pad results in reduced die area requirements for the metal pillar.

21 Claims, 12 Drawing Sheets

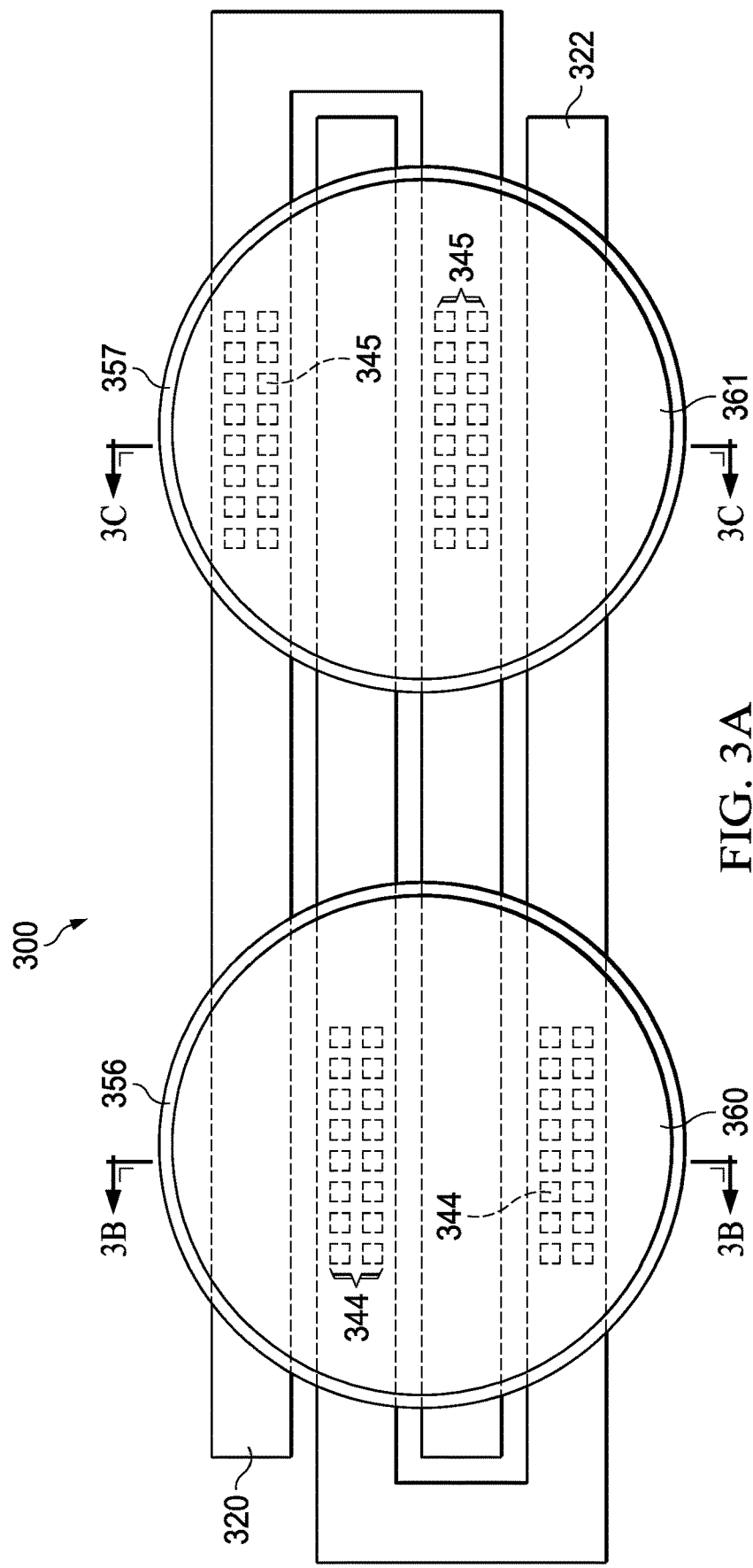

FET CONSTRUCTION WITH COPPER PILLARS OR BUMP DIRECTLY OVER THE FET

FIELD

This disclosure relates to the field of semiconductor devices. More particularly, this disclosure relates to fabrication processes for semiconductor devices.

BACKGROUND

An integrated circuit may contain a top metal layer which serves as a connection between the semiconductor device and a metal pillar, copper post, or copper bump used to connect the semiconductor device to a package. Typically, a metal pad or some other type of under bump metal (UBM) is used to provide a base on which to connect the metal pillar, post or bump which has a negative impact on die area. Typical methods may use two or three photolithography steps to pattern a top metal layer, pattern a bond pad to connect the UBM to the top metal layer, and finally a photolithography step to define the UBM layer. Methods to reduce the die area for metal pillar formation and methods to reduce the number of photolithography steps for metal pillar formation are needed.

SUMMARY

The present disclosure introduces a method of forming a semiconductor device with a metal pillar overlapping a first top metal interconnect and a second top metal interconnect. The metal pillar overlapping the first top metal interconnect and second top metal interconnect is connected to the first top metal interconnect by top metal vias while the second top metal interconnect is free of a direct electrical connection to the metal pillar.

Top metal vias are used to connect an under bump metal (UBM) to the top metal interconnect level in at least one embodiment. A stress relief layer between the protective dielectric layer and the metal pillar is used in at least one embodiment.

In accordance with one embodiment, the metal pillars are attached directly to an array of top metal vias without a bond pad of metal. The elimination of the bond pad layer reduces the mask count, processing, and cost of the device. In addition, the elimination of the bond pad results in reduced die area requirements for the metal pillar array.

These and other features of the present invention will be more readily apparent from the detailed description set forth below taken in conjunction with the accompanying drawings.

BRIEF DESCRIPTION OF THE VIEWS OF THE DRAWINGS

FIG. 3A through FIG. 3C are views of a first top interconnect layer connected to a first metal pillar which overlaps but does not connect to a second top interconnect layer, and a second top interconnect layer connected to a second copper pillar which overlaps but does not connect to the first top interconnect layer.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

Figure 1:
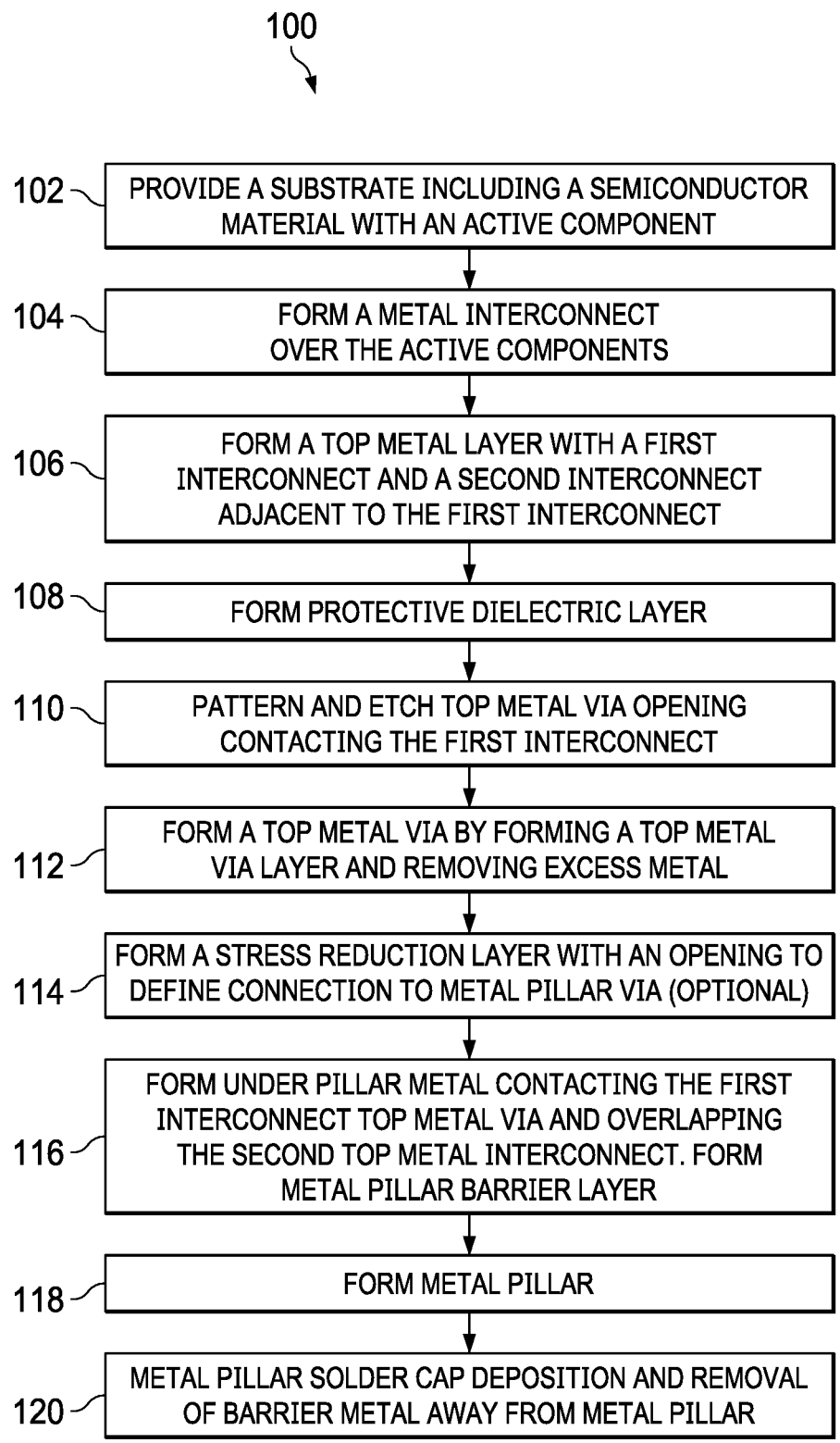
FIG. 1 is a flow diagram illustrating an example method for forming a semiconductor device in accordance with one or more aspects of the present disclosure.

FIG. 1 is a flowchart of an example method 100 of forming a semiconductor device 200, according to one or more aspects of this disclosure. The semiconductor device 200 and elements of the semiconductor device 200 are shown in FIG. 2A through FIG. 2H. The method 100 begins with step 102, providing a device substrate 202 including a semiconductor material 204. The device substrate 202 may be part of a semiconductor wafer containing additional unfinished semiconductor devices. The semiconductor device 200 may be implemented as an integrated circuit or a discrete component, by way of example. Other implementations of the semiconductor device 200 are within the scope of this example. The semiconductor device 200 includes a semiconductor component 212, such as a transistor.

In step 104, an interconnect region 206 is formed over the semiconductor component 212. The metal interconnect system includes dielectric layers, and may include interconnects 216, contacts 208 and vias 218, for example.

In step 106, a top metal layer is formed to complete the interconnect system. The top metal layer contains a first top metal interconnect lead 222 and a second top metal interconnect lead 220, which is adjacent to the first top metal interconnect lead 222. The top metal layer may contain more interconnect leads than the first top metal interconnect lead 222 and second top metal interconnect lead 220.

In step 108, a protective dielectric layer 226 is formed over the top metal layer. The protective dielectric layer 226 may include two or more sublayers of dielectric material, such as silicon dioxide, silicon nitride, silicon oxynitride, silicon carbide, silicon carbonitride, or aluminum oxide. The protective dielectric layer 226 formed in step 108 provides mechanical support for the top metal layer during a subsequent operation. The protective dielectric layer 226 may also contain a single dielectric material including one of silicon oxynitride or silicon nitride.

In step 110, top metal via features 238 are formed in the protective dielectric layer 226. The formation of the top metal via features 238 consists of a photolithography patterning step followed by a plasma etch step to form the top metal via features 238 through the protective dielectric layer 226 to the underlying first top metal interconnect. The etching of the top level via features 238 may be facilitated by the inclusion of a protective dielectric etch stop layer 224 of the protective dielectric layer 226, formed on the top metal layer. The protective dielectric etch stop layer 224, if used, is removed from the area for the top level via features 238.

In step 112, top metal vias 244 are formed. The formation of the top metal vias 244 consists of first forming a top metal via layer of copper or tungsten over the protective dielectric layer 226 and in the top level via features 238. After the formation of the top metal via layer, a chemical mechanical polish (CMP) process is used to remove excess metal over the protective dielectric and leave metal remaining in the top metal via features 238.

After the formation of the top metal vias 244, step 114 includes forming a stress relief layer 248 with a metal pillar via 252. The stress relief layer 248 is deposited on the wafer on top of the protective dielectric layer 226 and the top metal vias 244. The stress relief layer 248 is an optional feature and may include a polyimide, polybenzoxazole (PBO) or benzocyclobutene (BCB). After the deposition of the stress reduction layer, either a pattern and etch step or photosensitive developer step can be used to in conjunction with a photosensitive stress reduction layer to remove stress reduction material from areas necessary to form the metal pillar via 252. The metal pillar via 252 exposes the top metal via contacting the first top metal interconnect lead 222. The metal pillar via 252 overlaps the second metal interconnect. The second top metal interconnect lead 220 is not electrically connected to the metal pillar via 252.

Referring to step 116, in a first example where a stress reduction layer is not used, a metal pillar barrier layer 258 is formed. The metal pillar barrier layer 258 includes a material selected from a group consisting of titanium, tantalum, tungsten, titanium nitride, and tantalum nitride or titanium tungsten. The barrier metal layer being between 20 nanometers and 500 nanometers by way of example. After the barrier layer is deposited, a metal seed layer of copper is deposited on the wafer. The metal seed layer being between 20 nanometers and 500 nanometers thick by way of example. In a second example, after the formation of the stress reduction layer in step 114, a resist is deposited and patterned on the wafer. After the resist is patterned on the wafer, the metal pillar barrier layer 258 and metal seed layer are deposited.

In a third example, after the formation of the stress reduction layer in step 114, an optional under pillar metal layer may be formed in the metal pillar via, contacting the first top metal interconnect lead 222 through the top metal via and overlapping the second top metal interconnect lead 220. The second top metal interconnect lead 220 is not electrically connected to the under pillar metal layer. The under pillar metal layer may be formed from a material selected from a group consisting of copper and aluminum. After the formation of the under pillar metal layer, a metal pillar barrier layer 258 is and metal seed layer are deposited.

The under pillar metal layer and the under pillar barrier layer are removed in regions outside of the metal pillar via by a CMP or plasma etch process.

In the metal pillar formation step 118, a photoresist is deposited on the semiconductor wafer and is exposed in regions where pillars are to be formed. After exposure of the resist, the wafer is placed in an electroplating bath, which forms a metal pillar on the metal pillar barrier layer 258 by an electroplating process. After the electroplating process, the photoresist is removed, leaving the metal pillar. If an underlying barrier and metal seed layers remains after the electroplating process, a wet etch is used to remove the barrier and metal seed layers in areas which were not electroplated with metal pillars. The metal pillar overlaps to first top metal interconnect lead 222 and the second top metal interconnect lead 220. The metal pillar 260 is electrically connected to the first top metal interconnect lead 222 through the top metal via. The metal pillar 260 is not electrically connected to the second top metal interconnect lead 220. In at least one embodiment of the disclosure, a metal pillar cap 120 is added on top of the metal pillar 260. The metal pillar cap 120 includes a material selected from a group consisting of tin, zinc, antimony, copper, silver, bismuth, lead, and indium.

Figure 2A:
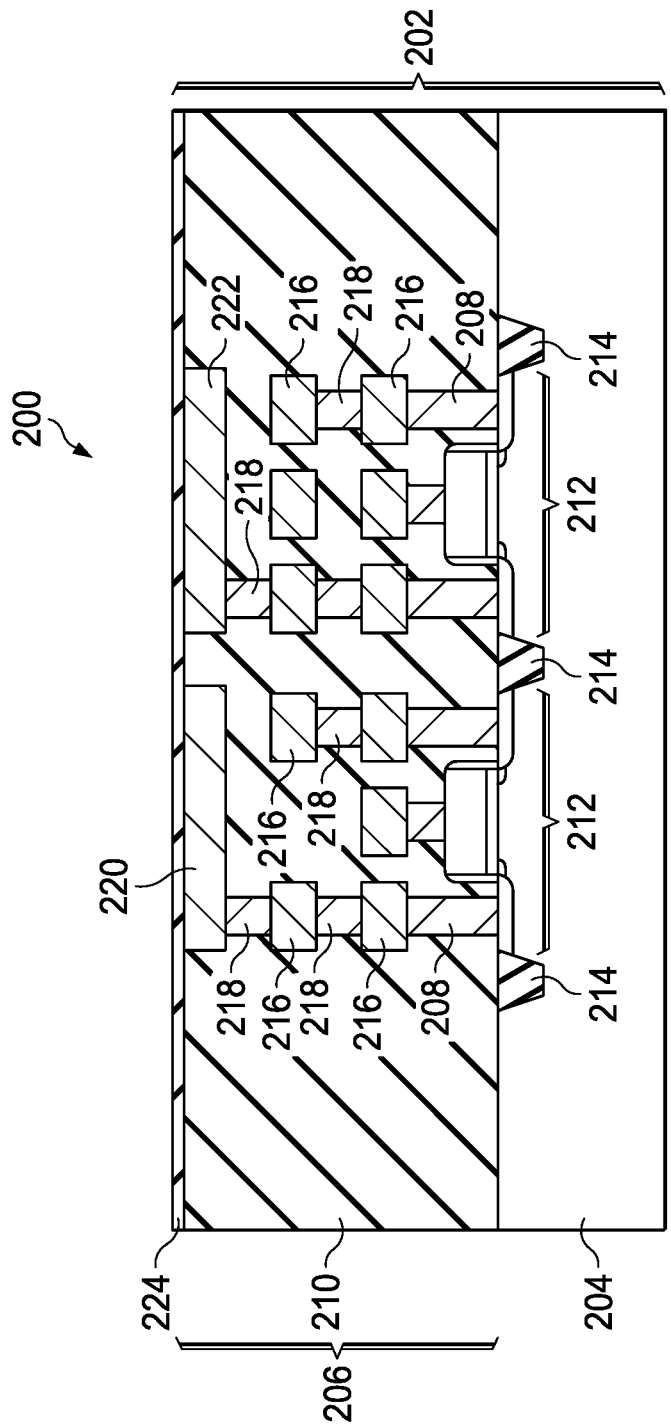
FIG. 2A through FIG. 2H are cross sections of a semiconductor device depicted in various stages of an example method of formation.

FIG. 2A through FIG. 2H are cross sections of the process steps in the formation of semiconductor device 200. Referring to FIG. 2A, the semiconductor device 200 may be implemented as an integrated circuit or a discrete component, and the device substrate 202 may be part of a semiconductor wafer containing additional semiconductor devices, not shown in FIG. 2A. The device substrate 202 includes a semiconductor material 204. The semiconductor material 204 may include crystalline silicon, or may include another semiconductor material 204, such as silicon germanium, silicon carbide, gallium nitride, or gallium arsenide, by way of example. The semiconductor device 200 includes an interconnect region 206 on the semiconductor material 204. The semiconductor device 200 further includes a semiconductor component 212; in this example, the semiconductor component 212 is implemented as a metal oxide semiconductor (MOS) transistor extending partway into the semiconductor material 204 and the interconnect region 206. Other implementations of the semiconductor component 212, such as a bipolar junction transistor, a diode, or a junction field effect transistor (JFET), are within the scope of this example. The semiconductor device 200 may include passive elements, such as trench isolation 214 located at the boundary between the semiconductor material 204 and the interconnect region 206.

The interconnect region 206 includes a dielectric material stack 210 with dielectric sublayers of silicon dioxide, phosphosilicate glass (PSG), fluorinated silicate glass (FSG), borophosphosilicate glass (BPSG), organosilicate glass (OSG), low-k dielectric material, silicon nitride, silicon oxynitride, silicon carbide, silicon carbide nitride, or other dielectric material. The interconnect region 206 includes electrically conductive elements, such as the contacts 208 which make the electrical connections to the semiconductor component 212 and the semiconductor material 204, interconnects 216 in one or more interconnect levels, wherein the interconnects 216 in a first of the interconnect levels make electrical connections to the contacts 208, and vias 218 which electrically connect the interconnects 216 in successive interconnect levels and is completed with a first top metal interconnect lead 222 and a second top metal interconnect lead 220 which is adjacent to the first top metal interconnect lead 222. While three levels of interconnect are shown, the number of interconnect levels varies depending on the application. Typically, between 2 and 9 levels of metal are used. A protective dielectric etch stop layer 224 is deposited over the interconnect region 206 in at least one embodiment of the disclosure. The protective dielectric etch stop layer 224 may include silicon nitride, for example, formed by a plasma enhanced chemical vapor deposition (PECVD) process using dichlorosilane and ammonia, or bis(tertiary-butyl-amino) silane, $SiH_2[NH(C_4H_9)]_2$ (BTBAS). The protective dielectric etch stop layer 224 may have a thickness of 100 nanometers to 300 nanometers, by way of example.

Figure 2B:
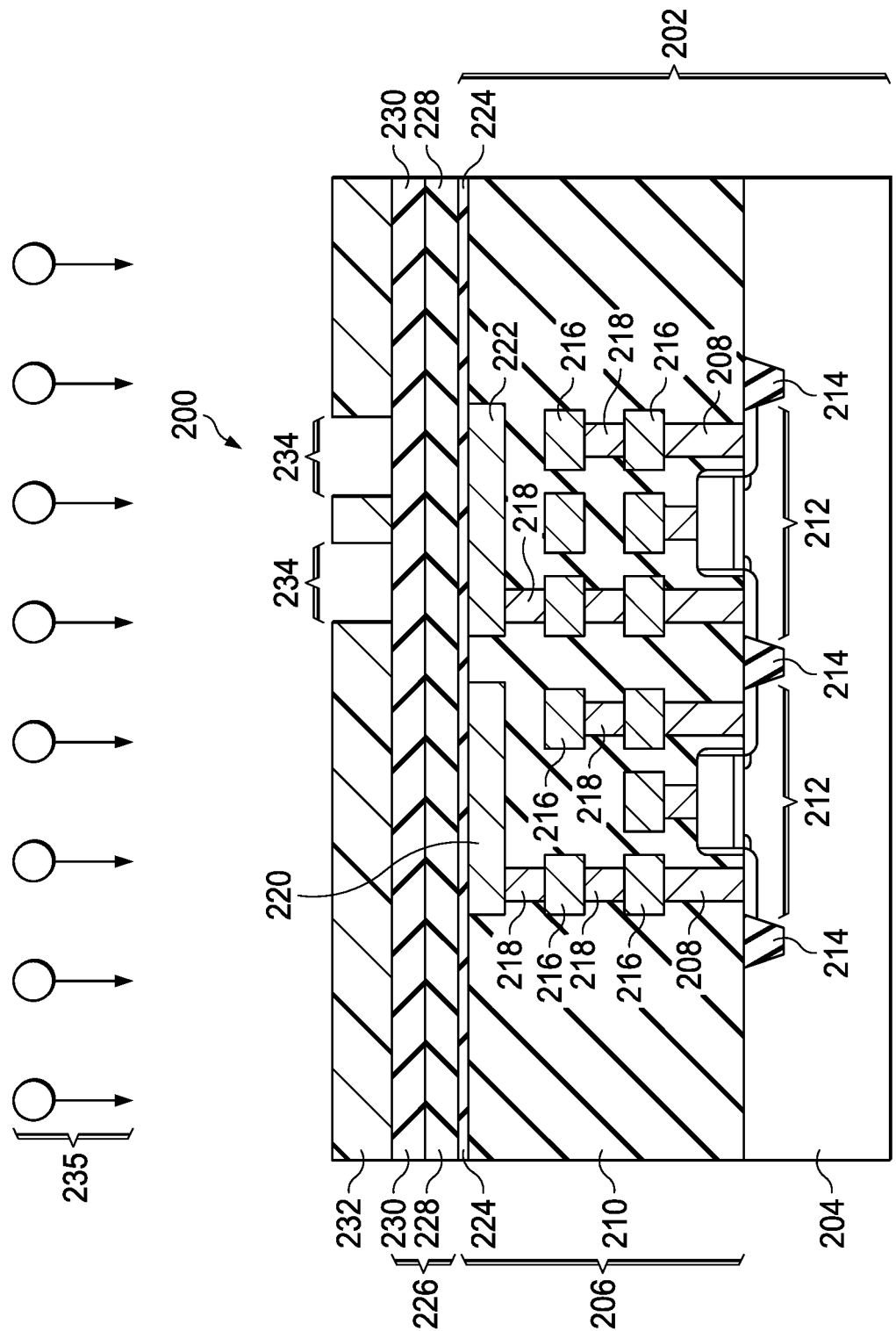

Referring to FIG. 2B, a protective dielectric layer 226 is formed over the protective dielectric etch stop layer 224. The protective dielectric layer 226 may include a first sublayer 228 formed on the protective dielectric etch stop layer 224 and a second sublayer 230 formed on the first sublayer 228. The first sublayer 228 may include silicon dioxide, formed by a PECVD process using tetraethyl orthosilicate (TEOS), $Si(OC_2H_5)_4$, and oxygen. The first sublayer 228 may have a thickness of 0.4 micron to 3 microns, by way of example. The second sublayer 230 may include silicon oxynitride, formed by a PECVD process using TEOS and BTBAS. The second sublayer 230 may have a thickness of 0.4 microns to 2 microns, by way of example. A protective dielectric layer 226 with multiple layers such as SiN/TEOS/SiON/TEOS may also be used. Other sublayer implementations for the protective dielectric layer 226, such as additional sublayers or other dielectric materials such as silicon carbide or aluminum oxide, are within the scope of this example. Alternatively, the protective dielectric layer 226 may be implemented with a single homogeneous layer of dielectric material. An etch mask 232 is formed over the protective dielectric layer 226 over the first top metal interconnect lead 222 in areas for top metal via resist openings 234. In at least one embodiment of the disclosure, the top metal via resist openings 234 can have an independent width and length. The etch mask 232 may include photoresist and may be formed by a photolithographic process. Removing the protective dielectric layer 226 in the top metal via resist openings 234 is done with a plasma etch process 235.

Figure 2C:
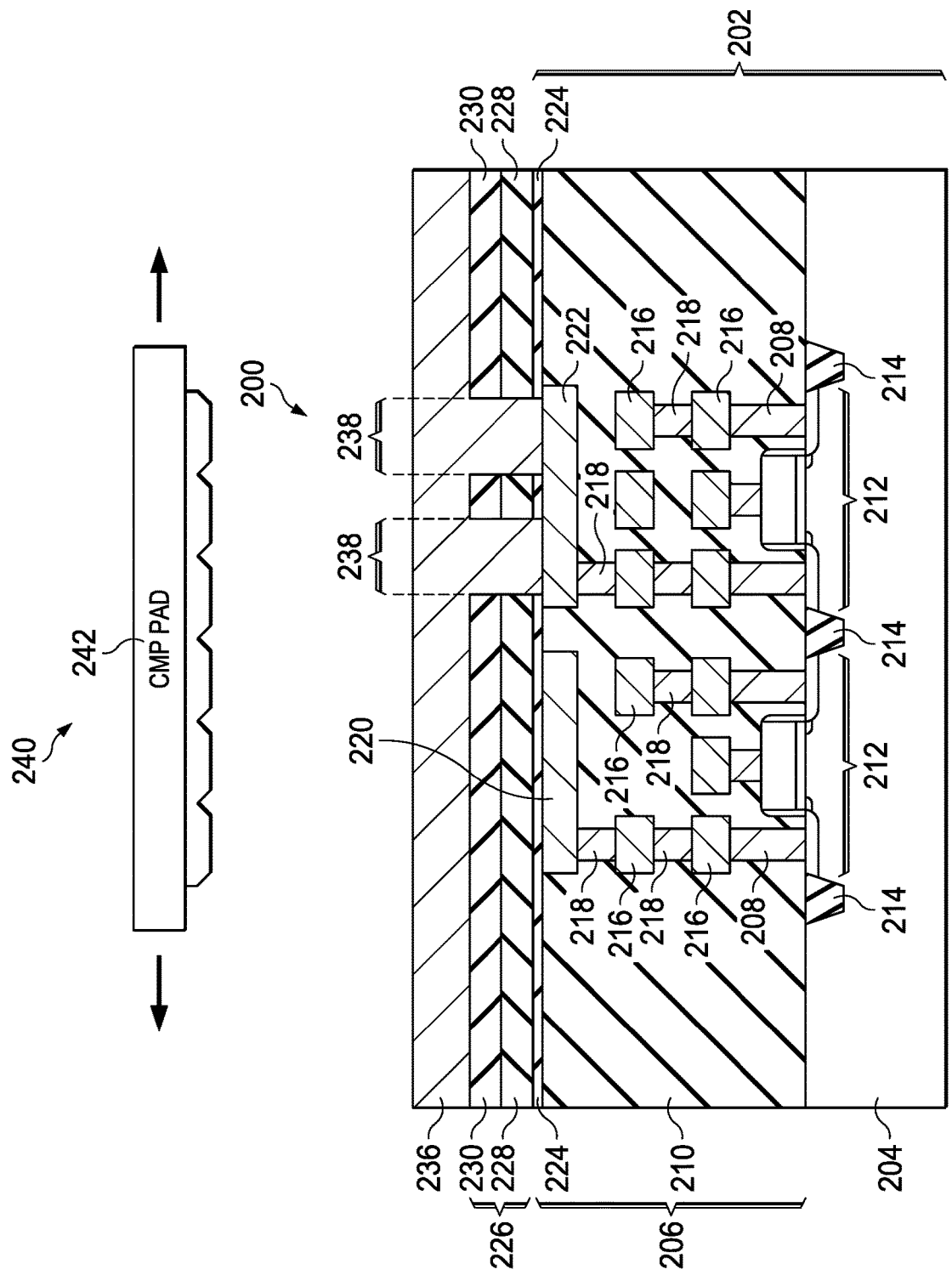

Referring to FIG. 2C, the protective dielectric layer 226 has top metal via features 238 formed by removal of the protective dielectric layer 226 in the top metal via resist openings 234 to expose the first top metal interconnect lead 222, of FIG. 2B. A top metal via layer 236 is formed over the protective dielectric layer 226, extends into the top metal via features 238, and makes contact with the first top metal interconnect lead 222. The top metal via layer 236 is electrically conductive and may consist of copper or tungsten, by way of example. The top metal via layer 236 may include an underlying barrier layer of Tantalum, Tantalum nitride, Titanium, Titanium nitride or a combination thereof by way of example. A CMP operation 240 using a CMP pad 242, removes the top metal via layer 236 from over the protective dielectric layer 226, leaving the top metal via layer 236 in the top metal via features 238 allowing connection of a metal pillar 260, shown in FIG. 2F, to the first top metal interconnect lead 222 while the protective dielectric layer 226 separates the second top metal interconnect lead 220 from the metal pillar 260.

Figure 2D:
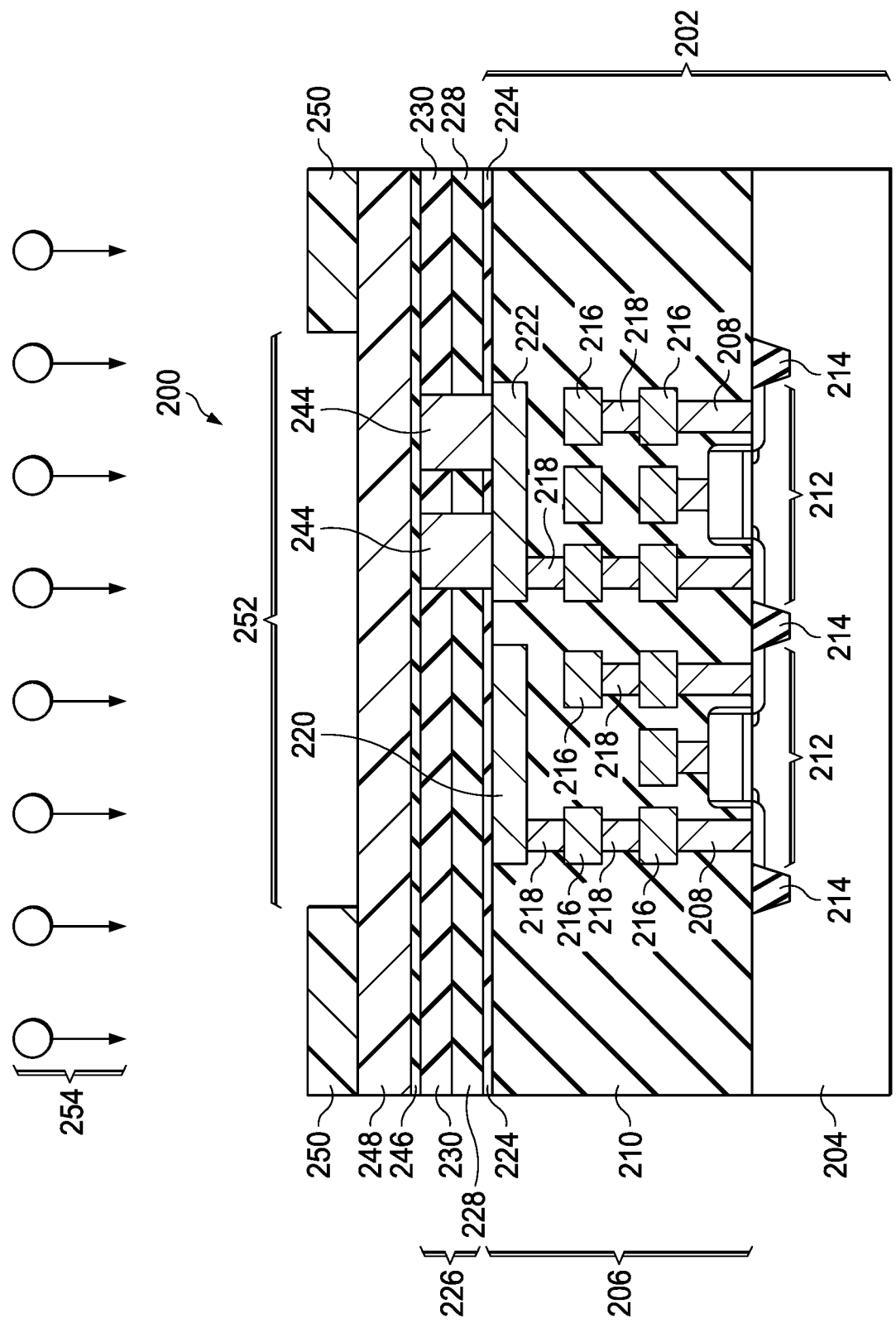

Referring to FIG. 2D, after the formation of the top metal vias 244 a stress relief etch stop layer 246 and a stress relief layer 248 are formed on top of the protective dielectric layer 226 in at least one embodiment of the disclosure. The stress relief etch stop layer 246 can consist of one of silicon nitride or silicon oxynitride. The stress relief layer 248 can consist of a polyimide, n-polybenzoxazole or material with like physical characteristics. After the deposition of the stress relief etch stop layer 246 and the stress relief layer 248, a photoresist layer 250 is deposited on top of the stress relief layer 248 and patterned. The photoresist layer 250 has an opening for a metal pillar via 252, shown in FIG. 2E, formed through the protective dielectric layer 226. The opening for the metal pillar via 252 exposes the areas that connect subsequent layers to the top metal vias 244. After the definition of the photolithographic pattern (not specifically shown), a plasma etch process 254 is used to etch the stress relief layer 248 and stress relief etch stop layer 246 to form the metal pillar via 252. After the plasma etch process 254, the resist is removed.

Figure 2E:
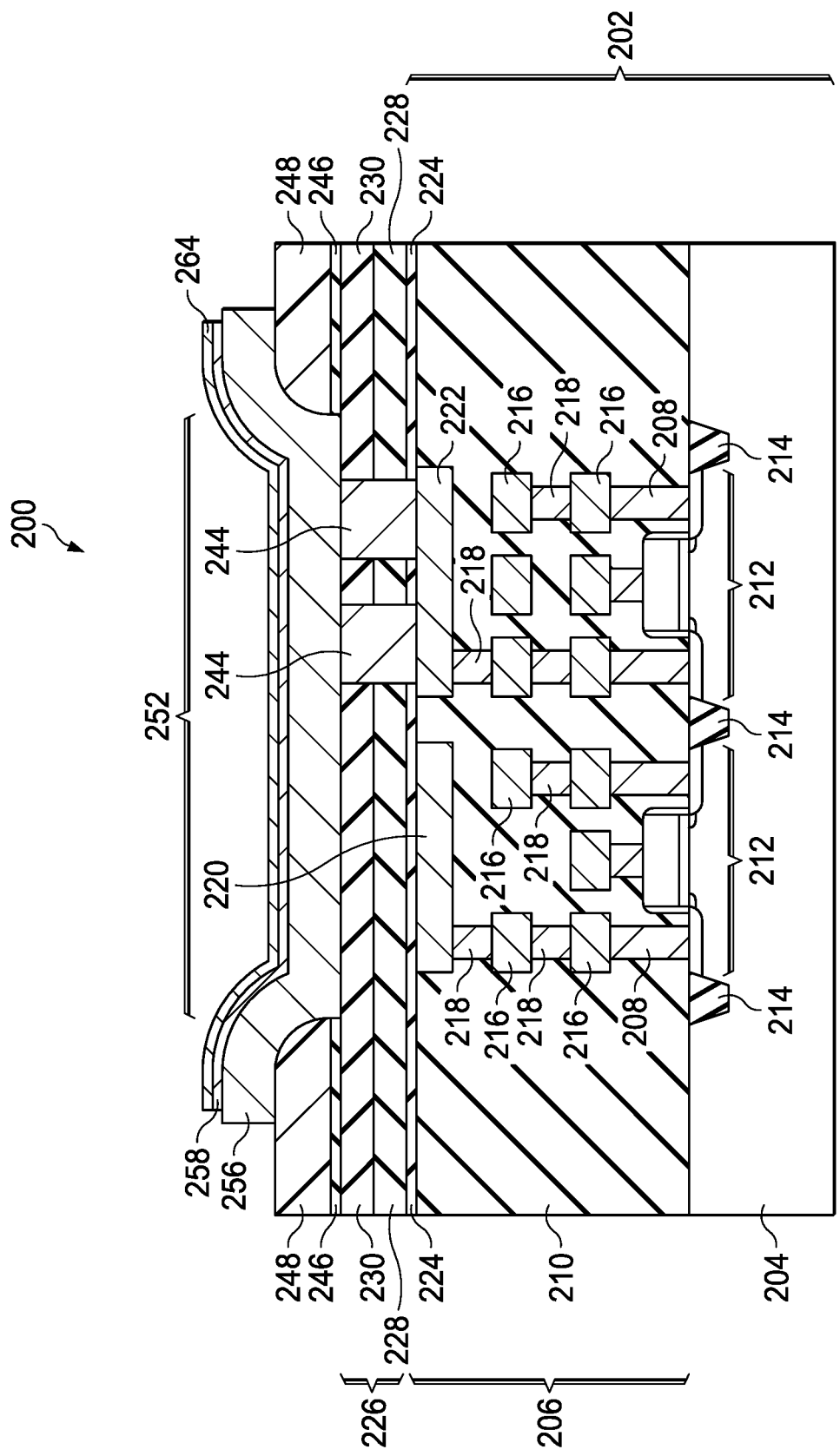

Referring to FIG. 2E, an under metal pillar metal layer 256 and an under metal pillar barrier layer 258 are deposited on the stress relief layer 248. The under metal pillar metal layer 256 and the under metal pillar barrier layer 258 extend into the metal pillar via 252 and contact the top metal vias 244. A photolithographic process and an etch process (not shown) define a region of under metal pillar metal layer 256 and under metal pillar barrier layer 258 over top metal vias 244 which are connected to the first top metal interconnect lead 222, while overlapping but not making a direct electrical connection with the second top metal interconnect lead 220. The under metal pillar barrier layer 258 is a barrier sublayer under the metal pillar 260. The under metal pillar barrier layer 258 including a material selected from a group consisting of titanium, tantalum, tungsten, titanium nitride, and tantalum nitride. After the formation of the under metal pillar barrier layer 258 a metal pillar seed layer 264 of copper is deposited.

Figure 2F:
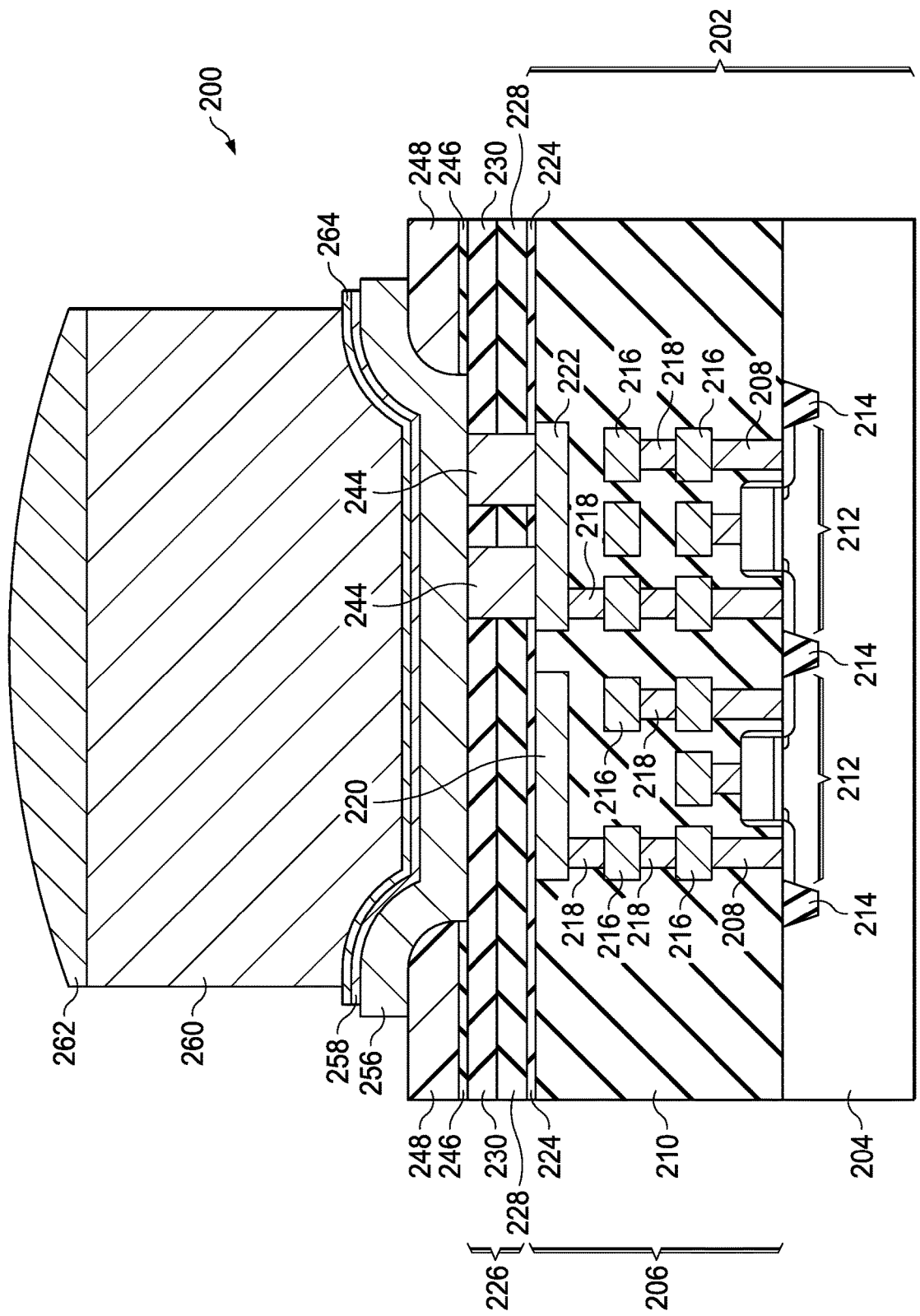

Referring to FIG. 2F, a cross section of the semiconductor device 200 including the metal pillar 260 and the metal pillar cap 262 are shown. A resist layer (not specifically shown) is coated on the semiconductor substrate or wafer. After patterning and exposure of the resist, openings are formed in the resist coincident with the under metal pillar barrier layer 258 and metal pillar seed layer 264. An electroplating bath is used to form the metal pillar 260 which plated on top of the barrier. The metal pillar 260 can be one of copper or nickel by way of example. After the electroplating process, the remaining resist is removed leaving the metal pillar 260, and a wet etch is used to remove the remaining barrier and metal seed layer. A metal pillar 260 can range in height from 30 microns to 120 microns by way of example.

After the metal pillar 260 is formed, in at least one embodiment, a metal pillar cap 262 is deposited on the top metal pillar. The metal pillar cap 262 may include solder, and may include a diffusion barrier with nickel between the metal pillar 260 and the solder. The metal pillar cap 262 can be formed using a stencil or electroplating by way of example.

Figure 2G:
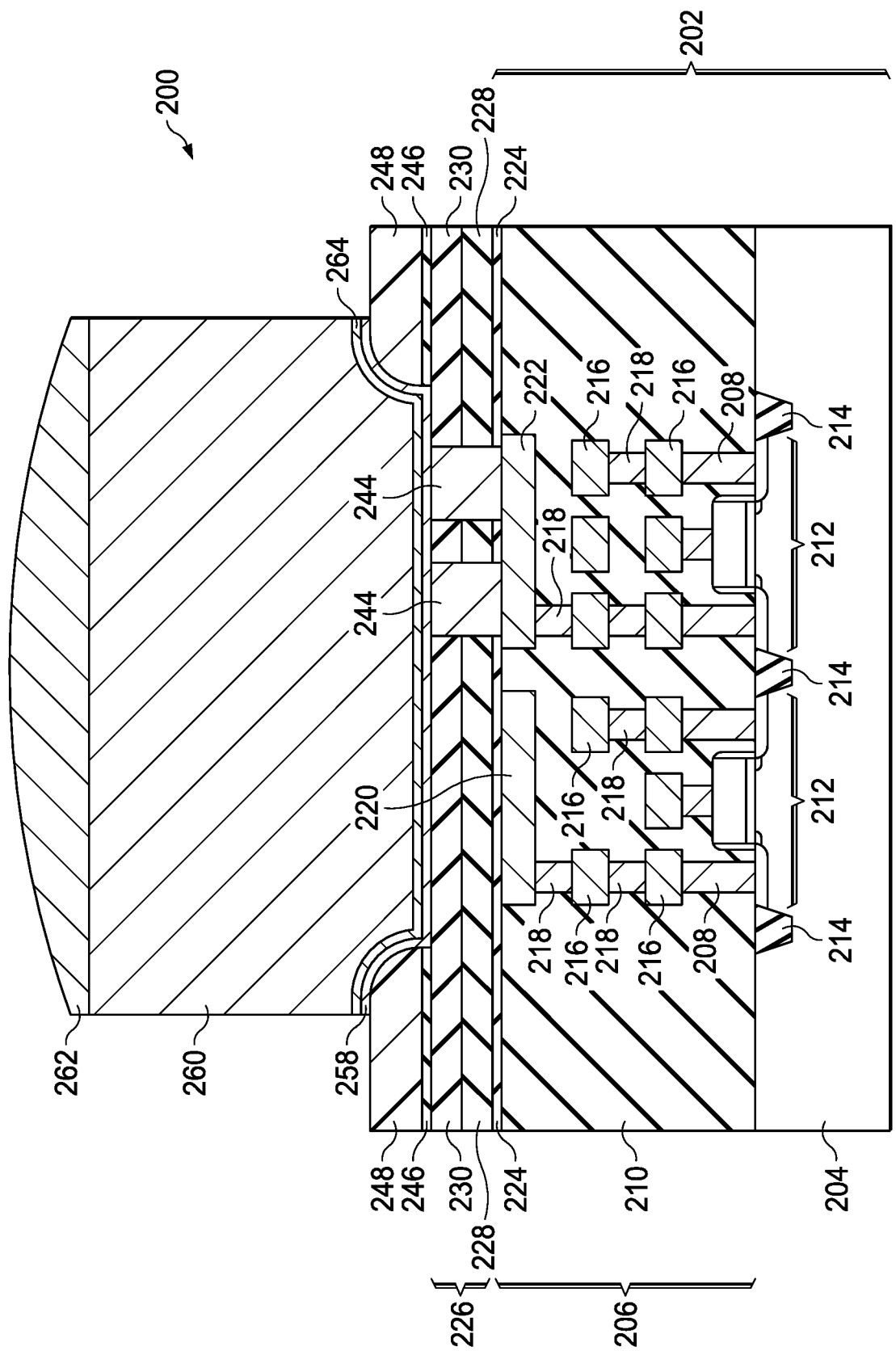

Referring to FIG. 2G, a cross section is shown of a semiconductor device 200 which contains a stress relief layer 248, but does not contain the under metal pillar metal layer 256 present in FIG. 2F.

Figure 2H:
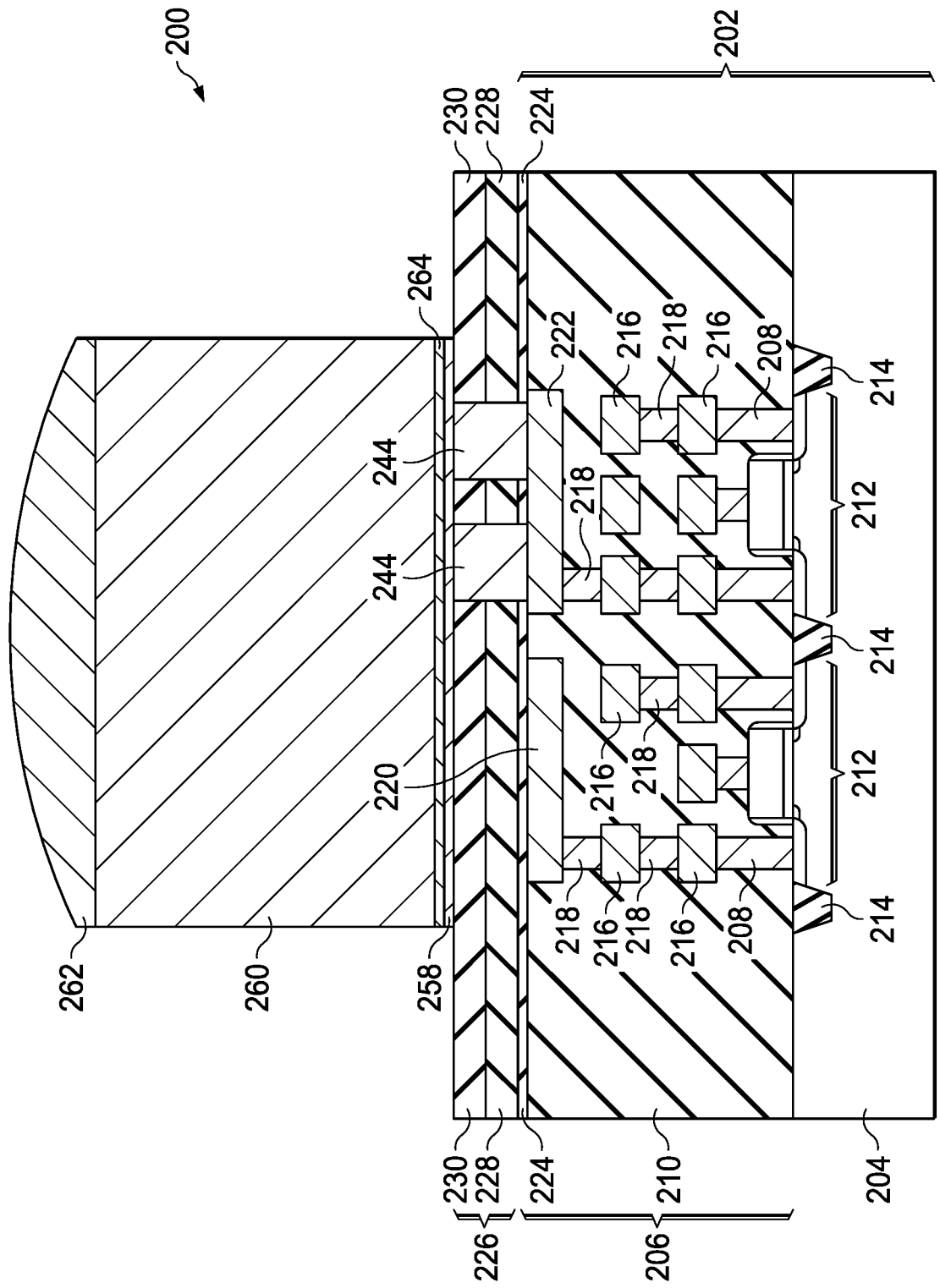

Referring to FIG. 2H, a cross section is shown of a semiconductor device 200 which does not contain the stress relief layer 248 or the under metal pillar metal layer 256 shown in FIG. 2F.

Referring to FIG. 3A, a top down view of an example semiconductor device 300 is shown. FIG. 3A shows a via level including connecting first top metal vias 344 through the protective dielectric layer and second top metal vias 345 through the protective dielectric layer, the first top metal vias 344 contacting the first top metal interconnect lead 322 and the second top metal vias 345 contacting the second top metal interconnect lead 320. A first metal pillar 360 is shown with a first under pillar metal layer 356 which electrically connects a first top metal interconnect 322 through a plurality of first top metal vias 344. While the first metal pillar 360 and first under pillar metal layer 356 overlap a second top metal interconnect 320 which is between two tines of the first top metal interconnect 322 of the example shown in FIG. 3A, the second top metal interconnect 320 is free of a connection to the first metal pillar 360 and first under pillar metal layer 356. Likewise, a second metal pillar 361 and second under pillar metal layer 357 are connected to the second top metal interconnect 320 through a plurality of second top metal vias 345. The first top metal interconnect 322 in FIG. 3A is overlapped by the second metal pillar 361, and is shown between two tines of the second top metal interconnect 320. The first top metal interconnect 322 is free of any connection to the second metal pillar 361 and second under pillar metal layer 357.

Figure 3B:
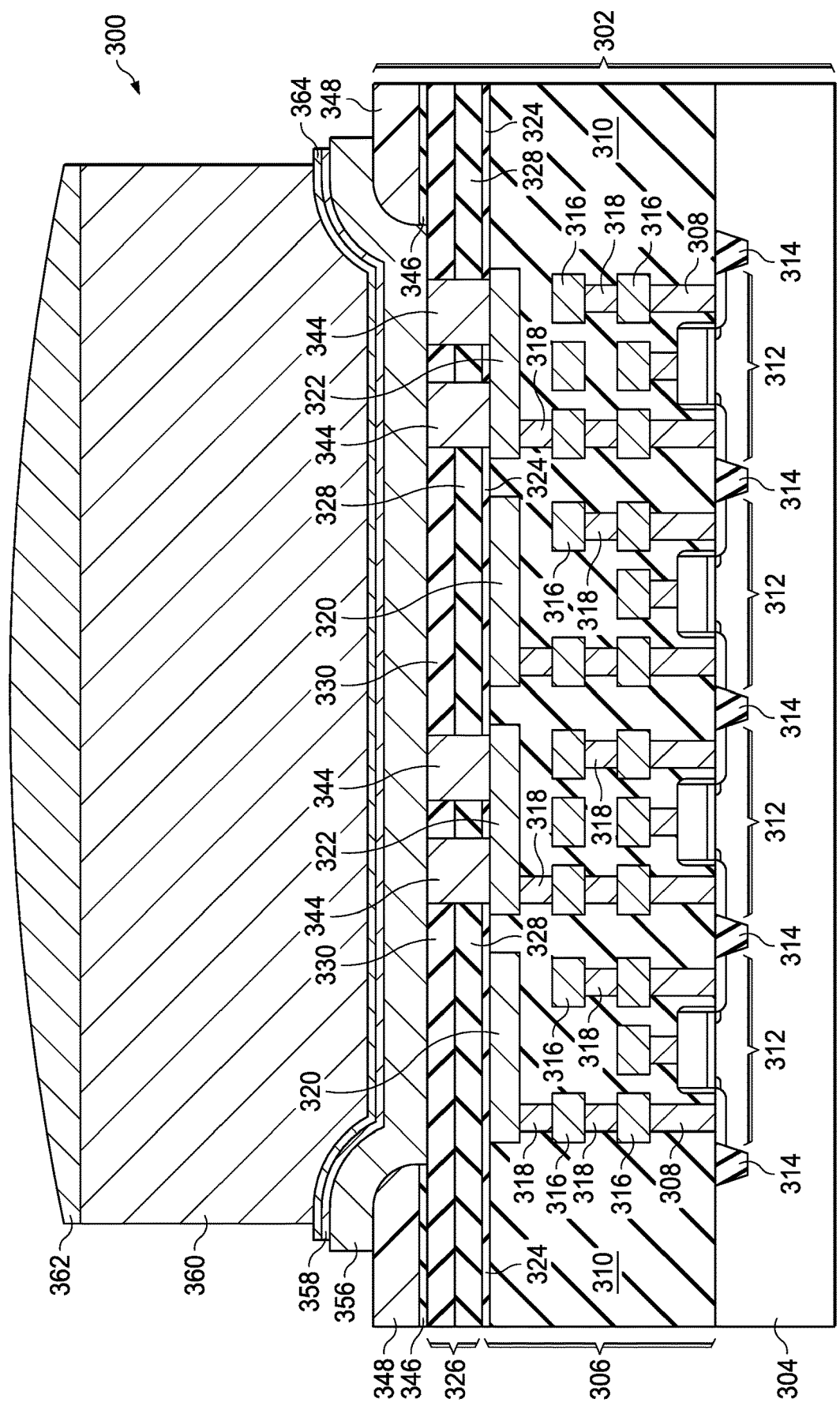

Referring to FIG. 3B, a cross section through the first metal pillar 360 and the first under pillar metal layer 356 is shown. The first metal pillar 360 and the first under pillar metal layer 356 connect to the first top metal interconnect 322 through first top metal vias 344. While the first metal pillar 360 and first under pillar metal layer 356 overlap the second top metal interconnect 320 which is interdigitated with the tines of the first top metal interconnect 322 of the example shown in FIG. 3B, the second top metal interconnect 320 is free of a connection to the first metal pillar 360 and first under pillar metal layer 356. Additional features shown in FIG. 3B include a device substrate 302, a semiconductor material 304, an interconnect region 306, contacts 308, a dielectric material stack 310, a semiconductor component 312, trench isolation, 314, interconnects 316, vias 318, a protective dielectric etch stop layer 324, a protective dielectric layer 326, a first sublayer 328, a second sublayer 330, a stress relief layer 348, under metal pillar barrier layer 358, a metal pillar seed layer 364 and a metal pillar cap 362, which are similar to corresponding features shown in FIG. 2A through FIG. 2H.

Figure 3C:
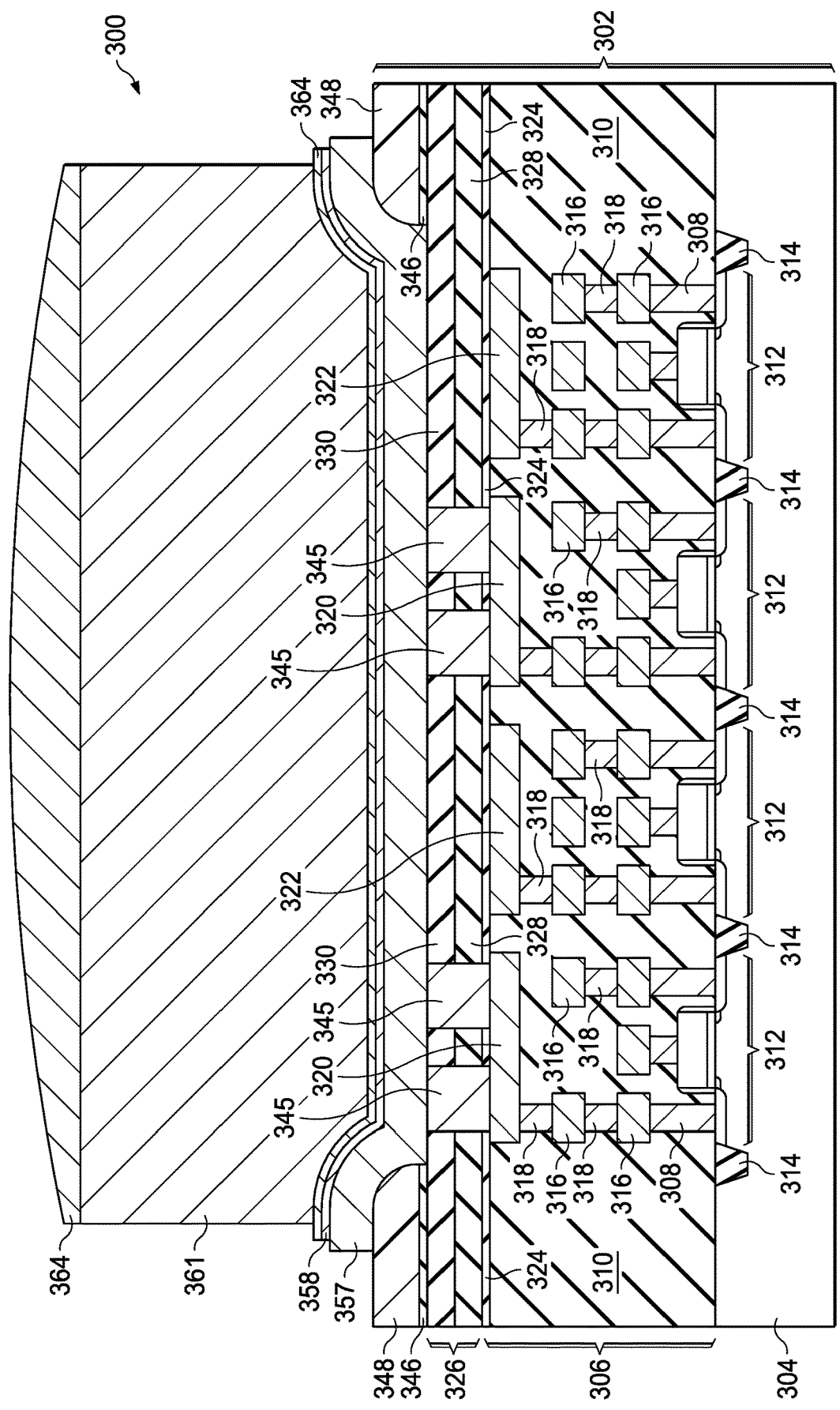

Referring to FIG. 3C, a cross section through the second metal pillar 361 and the second under pillar metal layer 357 is shown. The second metal pillar 361 and the second under pillar metal layer 357 connect to the second top metal interconnect 320 through second top metal vias 345. While the second metal pillar 361 and second under pillar metal layer 357 overlap the first top metal interconnect 322 which is interdigitated with the tines of the second top metal interconnect 320 of the example shown in FIG. 3C, the first top metal interconnect 322 is free of a connection to the second metal pillar 361 and second under pillar metal layer 357. Additional features shown in FIG. 3C include the device substrate 302, semiconductor material 304, interconnect region 306, contacts 308, dielectric material stack 310, semiconductor component 312, trench isolation 314, interconnects 316, vias 318, protective dielectric etch stop layer 324, protective dielectric layer 326, first sublayer 328, second sublayer 330, stress relief layer 348, under metal pillar barrier layer 358, metal pillar seed layer 364 and metal pillar cap 362.

In this disclosure and the claims that follow, one or more layers or structures may be described as including substances such as aluminum, tungsten, copper, silicon nitride, etc. These descriptions are to be understood in context and as they are used in the semiconductor manufacturing industry. For example, in the semiconductor industry, when a metallization layer is described as copper, it is understood that the metal of the layer includes copper as a principal component, but the copper may be, and typically is, alloyed, doped, or otherwise impure. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

Additionally, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques and/or deposition techniques such as chemical vapor deposition (CVD), physical vapor deposition (PVD), PECVD, or atomic layer deposition (ALD), for example.

It is noted that terms such as top, over, above, underlying, and below may be used in this disclosure. These terms should not be construed as limiting the position or orientation of a structure or element, but should be used to provide spatial relationship between structures or elements.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
   a substrate, the substrate including a semiconductor material;
   a semiconductor component extending into the semiconductor material;
   an interconnect region over the semiconductor component;
   a top metal layer in the interconnect region;
   a protective dielectric layer on the top metal layer;
   a first top metal interconnect lead in the top metal layer;
   a second top metal interconnect lead in the top metal layer;
   top metal vias through the protective dielectric layer, the top metal vias contacting the first top metal interconnect lead; and
   a metal pillar electrically connected to the top metal vias;
   wherein:
     the metal pillar extends over a portion of the second top metal interconnect lead;
     the protective dielectric layer separates the metal pillar from the second top metal interconnect lead; and
     the semiconductor device is free of a direct electrical connection through the protective dielectric layer from the metal pillar to the second top metal interconnect lead.

2. The semiconductor device of claim 1 wherein the metal pillar includes a barrier sublayer under the metal pillar, the barrier sublayer including a material selected from a group consisting of titanium, tantalum, tungsten, titanium nitride, and tantalum nitride.

3. The semiconductor device of claim 1 wherein the metal pillar includes a material selected from a group consisting of copper and nickel.

4. The semiconductor device of claim 1 wherein a metal layer electrically connects the top metal vias to the metal pillar, the metal layer including a material selected from a group consisting of copper and aluminum.

5. The semiconductor device of claim 1, wherein the metal pillar contains a cap over the metal pillar; the cap including a material selected from a group consisting of tin, zinc, antimony, copper, silver, bismuth, lead, and indium.

6. The semiconductor device of claim 1, wherein the protective dielectric layer includes a first sublayer over the top metal layer, and includes a second sublayer on the first sublayer, wherein the first sublayer includes a material selected from a group consisting of silicon dioxide and silicon oxynitride and the second sublayer includes a material selected from a group consisting of silicon oxynitride and silicon nitride.

7. The semiconductor device of claim 1, wherein the protective dielectric layer includes a dielectric material selected from a group consisting of silicon oxynitride and silicon nitride.

8. The semiconductor device of claim 1, wherein the protective dielectric layer includes an etch stop sublayer over the top metal layer.

9. The semiconductor device of claim 1, wherein the first top metal interconnect lead includes a first segment and a second segment with the second top metal interconnect lead located between the first segment and the second segment and wherein a first subset of top metal vias connect between the metal pillar and the first segment and a second subset of top metal vias connect between the metal pillar and the second segment.

10. A method of forming a semiconductor device, comprising:
    forming a semiconductor device extending into a semiconductor material of a device substrate;
    forming an interconnect region on the semiconductor device, the interconnect region including a top metal layer;
    forming a first top metal interconnect lead in the top metal layer and a second top metal interconnect lead in the top metal layer adjacent to the first top metal interconnect lead;
    forming a protective dielectric layer on the top metal layer;
    removing the protective dielectric layer in a top via openings in the protective dielectric layer to expose a portion of the first top metal interconnect lead;
    forming top metal vias in the top via openings contacting the first top metal interconnect lead; and
    forming a metal pillar on the top metal vias;
    wherein:
    the metal pillar extends over a portion of the second top metal interconnect lead;
    the protective dielectric layer separates the metal pillar from the second top metal interconnect lead; and
    the semiconductor device is free of a direct electrical connection through the protective dielectric layer from the metal pillar to the second top metal interconnect lead.

11. The method of claim 10, wherein forming a metal pillar includes forming a barrier sublayer on the metal pillar, the barrier sublayer including a material selected from a group consisting of titanium, tantalum, tungsten, titanium nitride, and tantalum nitride.

12. The method of claim 10, wherein forming the metal pillar includes a material selected from a group consisting of copper and nickel.

13. The method of claim 10, wherein forming a metal pillar cap over the metal pillar includes a material selected from a group consisting of tin, zinc, antimony, copper, silver, bismuth, lead, and indium.

14. The method of claim 10, wherein forming the protective dielectric layer includes forming a first sublayer over the top metal layer, and includes forming a second sublayer on the first sublayer, wherein the first sublayer includes a material selected from a group consisting of silicon dioxide and silicon oxynitride and the second sublayer includes a material selected from a group consisting of silicon oxynitride and silicon nitride.

15. The method of claim 10, wherein forming the protective dielectric layer includes forming a layer of a dielectric material selected from a group consisting of silicon oxynitride and silicon nitride.

16. The method of claim 10, wherein forming the protective dielectric layer includes forming a stress relief layer over the top metal layer and removing the stress relief layer in areas which exposes top metal vias.

17. The method of claim 10, further comprising forming a stress relief layer on top of the protective dielectric layer, the stress relief layer including a material selected from polyimide or n-polybenzoxazole.

18. The method of claim 10, wherein forming the metal pillar includes forming an under metal pillar metal layer which includes a material selected from a group consisting of copper and aluminum.

19. The method of claim 10, wherein forming the first top metal interconnect lead includes forming a first segment and a second segment with the second top metal interconnect lead located between the first segment and the second segment and wherein forming the top metal vias includes forming a first subset of top metal vias that connect between the metal pillar and the first segment and forming a second subset of top metal vias connect between the metal pillar and the second segment.

20. A semiconductor device, comprising:
    an interconnect region over a device substrate;
    a top metal layer in the interconnect region;
    a protective dielectric layer on the top metal layer;
    a first top metal interconnect lead in the top metal layer;
    a second top metal interconnect lead in the top metal layer;
    a via level including first top metal vias through the protective dielectric layer and second top metal vias through the protective dielectric layer, the first top metal vias contacting the first top metal interconnect lead and the second top metal vias contacting the second top metal interconnect lead; and
    a first metal pillar on the first top metal vias and a second metal pillar on the second top metal vias;
    wherein:
    the first metal pillar extends over a portion of the second top metal interconnect lead and the second metal pillar extends over a portion of the first top metal interconnect lead;
    the protective dielectric layer separates the first metal pillar from the second top metal interconnect lead and the second metal pillar from the first top metal interconnect lead; and
    the via level includes no vias between the first metal pillar and the second top metal interconnect lead and no vias between the second metal pillar and the first top metal interconnect.

21. The semiconductor device of claim 20, wherein the first top metal interconnect lead includes a first segment and a second segment with the second top metal interconnect lead located between the first segment and the second segment and wherein a first subset of first top metal vias connect between the first metal pillar and the first segment and a second subset of first top metal vias connect between the first metal pillar and the second segment.

* * * * *